(12) United States Patent
Ohmi et al.

(10) Patent No.: US 7,796,401 B2
(45) Date of Patent: Sep. 14, 2010

(54) CHIP ELEMENT

(75) Inventors: Tadahiro Ohmi, Miyagi (JP); Akihiro Morimoto, Miyagi (JP)

(73) Assignee: Foundation for Advancement of International Science, Ibaraki (JP)

( * ) Notice: Subject to any disclaimer, the term of this patent is extended or adjusted under 35 U.S.C. 154(b) by 615 days.

(21) Appl. No.: 11/663,958

(22) PCT Filed: Sep. 29, 2004

(86) PCT No.: PCT/JP2004/014668

§ 371 (c)(1),
(2), (4) Date: Mar. 28, 2007

(87) PCT Pub. No.: WO2006/035511

PCT Pub. Date: Apr. 6, 2006

(65) Prior Publication Data

US 2008/0049407 A1    Feb. 28, 2008

(51) Int. Cl.
*H05K 7/00* (2006.01)

(52) U.S. Cl. .............. 361/782; 361/762; 361/738; 361/739; 361/771; 361/760; 174/255; 174/258; 174/256

(58) Field of Classification Search .......... 361/763, 361/766, 728, 739, 782, 821, 771, 768, 760, 361/761, 762, 738, 748, 807, 746, 736, 751, 361/757; 174/260, 255, 258, 256, 250
See application file for complete search history.

(56) References Cited

U.S. PATENT DOCUMENTS

| | | | |
|---|---|---|---|
| 6,713,162 B2 | 3/2004 | Takaya et al. | |
| 6,987,307 B2* | 1/2006 | White et al. | 257/508 |
| 2002/0009577 A1* | 1/2002 | Takaya et al. | 428/209 |
| 2002/0132898 A1* | 9/2002 | Takaya et al. | 524/445 |
| 2005/0003199 A1 | 1/2005 | Takaya et al. | |
| 2007/0030659 A1* | 2/2007 | Suzuki et al. | 361/793 |

FOREIGN PATENT DOCUMENTS

| | | |
|---|---|---|
| JP | 2-205308 | 8/1990 |
| JP | 10-233302 | 9/1998 |
| JP | 11-162719 | 6/1999 |
| JP | 2001-345212 A | 12/2001 |
| JP | 2002-343031 A | 12/2002 |
| JP | 2004-128460 A | 4/2004 |
| JP | 2004-221572 A | 8/2004 |

* cited by examiner

*Primary Examiner*—Dameon E Levi
*Assistant Examiner*—Hoa C Nguyen
(74) *Attorney, Agent, or Firm*—Foley & Lardner LLP

(57) ABSTRACT

A chip element according to this invention can reduce the influence of parasitic capacitance and parasitic inductance when used in a GHz band. A substrate is formed of a low permittivity material having a permittivity low enough to reduce parasitic capacitance in a GHz band. Parasitic capacitance inherent to the chip element is reduced.

8 Claims, 5 Drawing Sheets

(a)

(b)

CHIP ELEMENT

TECHNICAL FIELD

This invention relates to a leadless-type chip element that is used by being mounted on a printed board or the like and, in particular, relates to a chip resistance element and a chip inductance element.

BACKGROUND ART

Generally, chip elements such as chip resistors, chip inductors, and chip capacitors each formed as a chip are widely used as components to be mounted on printed wiring boards. Such chip elements can improve a mounting density per unit area.

Those components are each completed by forming a wiring structure, adapted to realize its function, on a ceramic substrate of alumina, ferrite, or the like, covering the wiring structure with a glass, a resin, or the like, and forming electrodes at end portions of the wiring structure.

The reason for using the ceramic as a packaging material covering the wiring structure is to provide heat resistance against a high temperature process at 200° C. to 300° C., such as a solder reflow process, performed at the time of mounting on a printed wiring board of glass epoxy, or the like.

Further, such a chip element is mounted on a printed wiring board and used, for example, as a terminal resistor of a microstrip line widely used as a signal transmission line, or the like, or as a matching element for high-frequency signals of a portable telephone or the like. In this case, 50Ω is generally used as a characteristic impedance of the foregoing signal transmission line.

On the other hand, in order to supply a sufficient signal to wiring of such a 50Ω system from an active element such as an LSI, for example, buffer circuits are formed at input/output portions of the LSI and a large current is generated by the buffer circuits, thereby driving the wiring of the 50Ω system.

In any event, it is expected that chip elements of this type will be used in a higher frequency region, i.e. even in a frequency band of 1 GHz or more.

On the other hand, as chip elements of this type, there are those described in Japanese Unexamined Patent Application Publication (JP-A) No. H11-162719 (Patent Document 1), Japanese Unexamined Patent Application Publication (JP-A) No. H10-233302 (Patent Document 2), and Japanese Patent (JP-B) No. 2739334 (Patent Document 3). Among them, Patent Document 1 discloses a chip resistor in which a resistor and two electrode terminals connected to the resistor are insert-molded with a thermosetting unsaturated polyester resin. On the other hand, Patent Document 2 discloses a chip resistor in which a base electrode and a film resistor made of ruthenium oxide are formed on an insulating chip substrate made of a liquid crystal polymer. Further, Patent Document 3 discloses an impedance element that uses a magnetic material extrusion-molded from a magnetic paste obtained by mixing and kneading a ferromagnetic powder, a binding resin, and a solvent, and a manufacturing method thereof.

However, it has been found that there arises a problem that the impedance changes from a design value in a high frequency region of 1 GHz to 10 GHz in the case of a conventionally used chip element, particularly a chip resistance element or a chip inductance element.

This problem is remarkable particularly in a high resistance region exceeding 100Ω in the case of the chip resistance element and is remarkable particularly in a high inductance region exceeding 1 nH in the case of the chip inductor element.

Patent Document 1 discloses the chip resistor excellent in heat resistance and molding efficiency and its manufacturing method, wherein the resistor is insert-molded in the thermosetting unsaturated polyester resin. Therefore, Patent Document 1 suggests nothing about using the chip resistor in a GHz band and thus does not indicate a measure therefor.

Further, Patent Document 2 proposes to use the liquid crystal polymer chip substrate for suppressing an increase in cost when a ceramic substrate is used, but this Patent Document 2 also suggests nothing about using the chip resistor at high frequencies of a GHz band and a problem in that event.

Patent Document 3 has no description about a particle size of the magnetic powder and a permittivity of the resin that are necessary for making high frequency characteristics excellent, suggests nothing about an impedance element for use at high frequencies and thus does not indicate a measure therefor. Further, since a conductor layer is extrusion-molded, there arises a problem that a complicated circuit pattern such as a coil cannot be formed.

DISCLOSURE OF THE INVENTION

This invention points out a problem that arises when a chip element is used in a high frequency band, i.e. a GHz band, and aims to solve it.

It is an object of this invention to provide a chip resistance element that can reduce the influence of parasitic capacitance and parasitic inductance when used in a GHz band.

It is another object of this invention to provide a chip inductance element that can be used even in a GHz band.

It is a specific object of this invention to reduce parasitic capacitance inherent to a chip element, thereby providing a chip resistance element that can be used with about several hundred Ω to 1 kΩ or more at about 10 GHz or more while, conventionally, a chip resistance element with only about several ten Ω can be used.

It is another specific object of this invention to provide a chip inductance element that can realize an inductance value of about several ten nH or more at a frequency of about several ten GHz or more.

According to an aspect of this invention, there is obtained a chip element in which an impedance element and a plurality of electrodes connected to the impedance element are formed on a substrate, the chip element characterized in that the substrate is formed of a low permittivity material having a permittivity low enough to reduce parasitic capacitance in a GHz band. Herein, the chip element is a chip resistance element or a chip inductance element and the low permittivity material is an insulating material having a resistivity of 1 kΩcm or more when measured by JISC3005.

Further, the low permittivity material is preferably a resin being an organic material or organic compounds. In this case, the resin may be selected from the group consisting of a fluororesin, an acrylic resin, an epoxy resin, a liquid crystal resin, a phenolic resin, a polyester resin, a denatured polyphenyl ether resin, a bismaleide triazine resin, a denatured polyphenylene oxide resin, a silicon resin, a benzocyclobutene resin, a polyethylene naphthalate resin, a polycycloolefin resin, a polyolefin resin, a cyanate ester resin, and a melamine resin. Further, the low permittivity material preferably has a relative permittivity of 4 or less.

BEST MODE FOR CARRYING OUT THE INVENTION

At first, referring to FIGS. 1, (a) and (b), problems inherent to chip elements will be pointed out and a principle of this invention will be explained.

Figure 1:
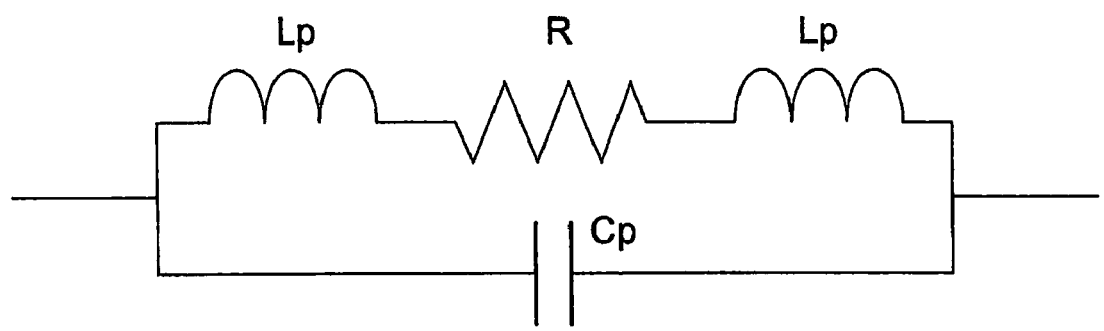
FIGS. 1, (a) and (b) are circuit diagrams for pointing out problems of a chip resistance element and a chip inductance element.
Figure 1:
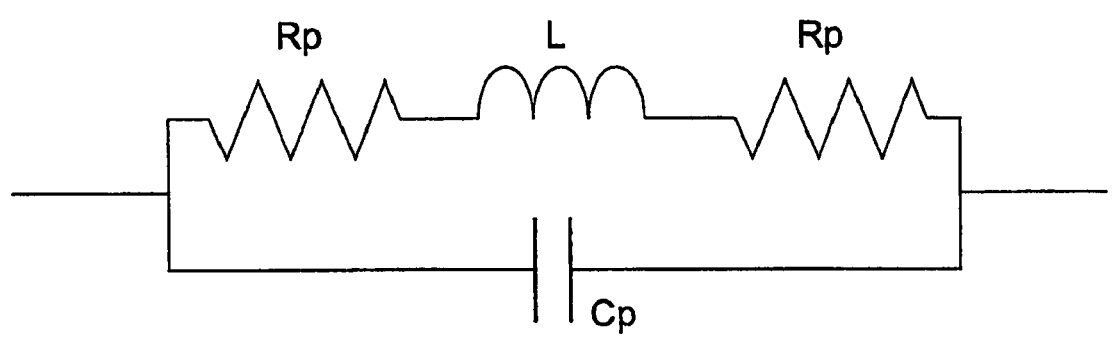

FIGS. 1, (a) and (b) show equivalent circuits of chip components, respectively, wherein (a) shows the case of a chip resistance element and (b) shows the case of a chip inductor element.

As shown in FIG. 1, (a), the chip resistance element comprises a true resistance component R adjusted to a desired DC resistance value using laser trimming or the like, parasitic inductor components Lp connected in series therewith, and a parasitic capacitance component Cp connected in parallel therewith. Impedances of the parasitic inductor component Lp and the parasitic capacitance component Cp are represented by $\omega L$ and $1/(\omega C)$, respectively, using an angular frequency $\omega$. Therefore, as the frequency increases, the impedance increases with respect to the parasitic inductance while decreases with respect to the parasitic capacitance. Magnitudes of such parasitic components are normally about several hundred pH to several nH with respect to the parasitic inductance Lp and about several ten fF to several hundred fF with respect to the parasitic capacitance Cp. If these values are calculated to derive, for example, impedances at 10 GHz, the impedances become about several $\Omega$ to several ten $\Omega$ with respect to the parasitic inductance Lp and about several k$\Omega$ to several hundred $\Omega$ with respect to the parasitic capacitance Cp.

In the case where these parasitic components constitute the equivalent circuit shown in FIG. 1, (a), if a value of the resistance value R is smaller than an approximation of the impedance by the parasitic inductance component Lp, the parasitic inductance component Lp becomes dominant and thus the value of the impedance cannot be reduced. Likewise, if a value of the resistance value R is greater than an approximation of the impedance by the parasitic capacitance component Cp, the capacitance component becomes dominant and thus the value of the impedance cannot be increased. As a result, a value usable by the chip resistor in a high frequency region is only about several ten $\Omega$.

On the other hand, the chip inductor element shown in FIG. 1, (b) comprises a true inductance component L adjusted to a desired inductance component, parasitic resistance components Rp connected in series therewith, and a parasitic capacitance component Cp connected in parallel therewith. A self-resonant frequency being an index indicating high frequency characteristics of inductance is expressed by $f=1/(2\pi\sqrt{(LCp)})$, using a true inductance L and a parasitic capacitance Cp.

This self-resonant frequency represents an upper-limit frequency where an inductor can be used as an inductance. In a frequency region higher than this frequency, the inductor loses its inductive properties and operates as a capacitance.

A chip inductor is generally formed by stacking conductor thin films through a dielectric in order to obtain a high inductance value. In this case, since parasitic capacitance is formed between the conductor thin films, the total parasitic capacitance value becomes about several hundred fF to several pF, which is larger as compared with the case of a chip resistance element. Therefore, in the case of an inductance value exceeding several nH, the self-resonant frequency becomes about several GHz to 10 GHz or less and thus there arises a problem that it cannot be used as an inductor at high frequencies of 10 GHz or more. As a result, a value of about several nH at the most becomes an upper limit as an inductance usable at 10 GHz, which is about several ten $\Omega$ when calculated in terms of impedance.

Further, since the foregoing chip inductor uses a dielectric material such as ferrite for increasing an inductance value, hysteresis loss or the like of the material is large and thus the usable frequency becomes about 100 MHz or less.

As described above, it is difficult to realize a chip resistor or a chip inductor usable at about 10 GHz or more due to the presence of parasitic components and use is limited to the impedance of about several ten $\Omega$. As a result, the characteristic impedance of a signal propagation line formed on a wiring board using the chip element as a matching element or a terminal element should be limited to about several ten $\Omega$ and, therefore, it has been difficult to increase the characteristic impedance so as to reduce the current component flowing in the signal propagation line, thereby reducing the power consumption.

In view of the foregoing points, this invention has paid attention to a substrate of a chip element and used, as the substrate, a plastic, i.e. a resin material, being a low dielectric material having a permittivity of 4 or less. It has been found that, using the substrate of the low dielectric material as described above, it is possible to reduce parallel parasitic capacitance of a chip resistor or a chip inductor, thereby forming an element with only slight degradation of impedance characteristics even in a high frequency region, i.e. a GHz band.

Further, according to this invention, since parallel parasitic capacitance is reduced in a chip resistance element formed using a substrate of a low dielectric material, it has been found that it is possible to form a good quality chip resistance element with only slight degradation of impedance characteristics even in a high resistance region of a GHz band.

Further, since parallel parasitic capacitance is reduced in a chip inductor element of this invention, it is possible to form an element with only slight degradation of impedance characteristics even in a high inductance region. Further, since fine magnetic materials are dispersed in a dielectric and behave as superparamagnetic materials in a chip inductor element of this invention, it is possible to reduce hysteresis loss or the like while increasing the permeability and, therefore, it is possible to form a small, low-loss inductance.

Hereinbelow, embodiments of this invention will be described.

Embodiment 1

Figure 2:
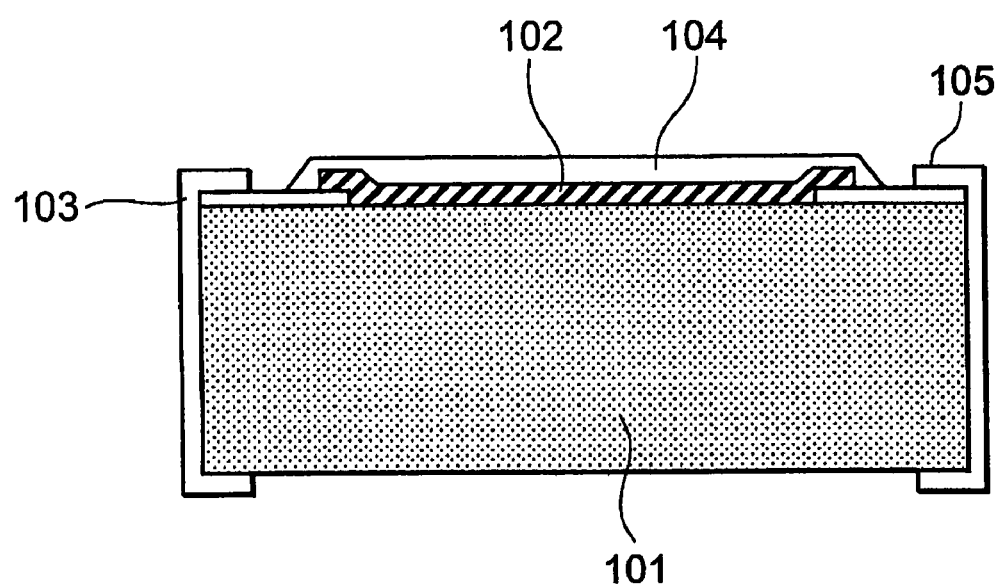
FIG. 2 is a sectional view showing the structure of a chip resistance element according to a first embodiment of this invention.

A chip resistance element according to embodiment 1 of this invention will be described with reference to FIG. 2. FIG. 2 is a sectional view showing one example of the chip resistance element according to embodiment 1, wherein the chip resistance element comprises a low permittivity substrate 101, a resistor 102 formed on the low permittivity substrate, a first electrode 103 for electrical contact with the resistor, a protective film 104 for protecting the surface of the resistor, and a second electrode 105 for electrical contact with the first electrode.

The relative permittivity of the foregoing low permittivity substrate is preferably 4 or less, more preferably 3 or less, and further preferably 2.5 or less. It has been found that, using the low permittivity substrate in this manner, for example, a 1 kΩ chip resistance element, which cannot be used conventionally at 1 GHz or more, is sufficiently usable at a frequency of about 1 GHz or more.

Hereinbelow, the reason for this will be explained.

Figure 3:
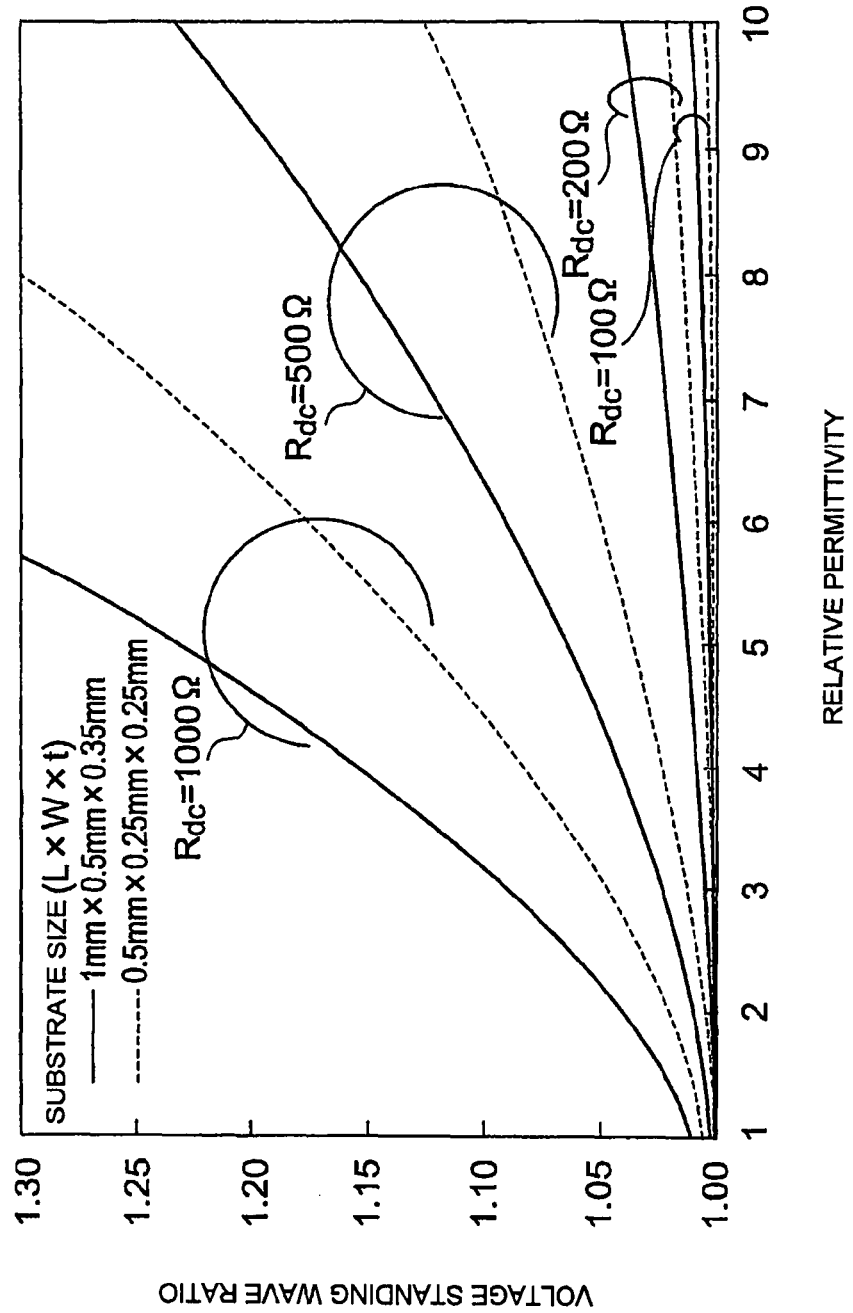
FIG. 3 is a graph showing changes in relative permittivity and substrate resistance.

FIG. 3 shows high frequency impedance relative to DC resistance in terms of voltage standing wave ratio normally used as an index of the performance of a high frequency element, wherein the axis of abscissas represents the substrate permittivity in the case of a general chip resistor having a size of 1 mm×0.5 mm. It is reported that the voltage standing wave ratio provides excellent connection when it is about 1.2 or less and more preferably 1.1 or less.

As clear from FIG. 3, in the case of a resistance Rdc of about 100 to 200Ω, a voltage standing wave ratio of 1.1 or less is obtained even with a relative permittivity of about 10, while, if the resistance Rdc increases to 500Ω to 1000Ω, the voltage standing wave ratio rapidly increases. This represents that the voltage standing wave ratio depends on the relative permittivity of a material used for a substrate of a chip element.

In this invention, it has been found based on this knowledge that a chip element usable even in a GHz band is obtained by selecting a material with a low relative permittivity as a substrate of the chip element. Specifically, as clear from FIG. 3, the relative permittivity of a substrate dielectric is preferably 4 or less, more preferably 3 or less, and further preferably 2.5 or less.

Further, the dielectric loss of a material forming a substrate is preferably $1\times10^{-2}$ or less, more preferably $1\times10^{-3}$ or less, and further preferably $1\times10^{-4}$ or less. Further, the glass transition temperature being one of indices of thermal properties is preferably 100° C. or more, more preferably 150° C. or more, and further preferably 200° C. or more.

As a material satisfying the foregoing conditions, there is a polycycloolefin resin or a polyolefin resin having a permittivity of 2 to 3, tan $\delta=2\times10^{-4}$ to $9\times10^{-3}$, and a glass transition temperature of 200 to 300° C. Further, use can also be made of a fluororesin having a permittivity of 2 to 2.5, tan $\delta$=about $1\times10^{-3}$, and a glass transition temperature of about 150° C. Further, use can also be made of a liquid crystal resin or the like having a permittivity of 2.5 to 3, tan $\delta$=about $1\times10^{-3}$, and a glass transition temperature of about 200 to 300° C.

Since a chip resistor of this invention uses a low permittivity substrate as its substrate, the parasitic capacitance can be reduced as compared with a conventional one and therefore it is possible to form a chip resistor without degradation in resistance value even in a high frequency region. Since the chip resistor according to this embodiment 1 has a small amount of parasitic capacitance component and exhibits characteristics of no degradation in resistance value even in a high frequency region, it is possible to form a high frequency circuit with only slight degradation of characteristics. Further, since the foregoing resin having high heat resistance is used as a substrate material, there is no degradation in heat resistance even in a high temperature process, such as a solder reflow process.

Embodiment 2

Figure 4:
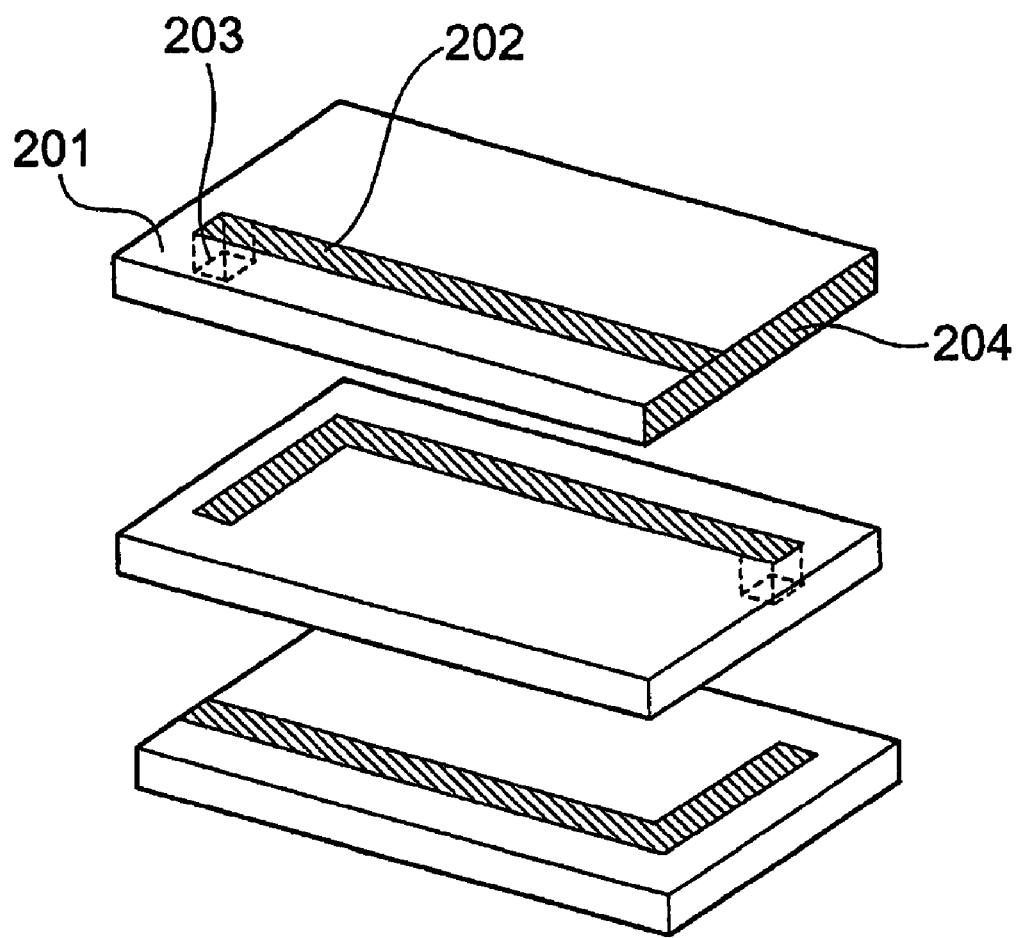
FIG. 4 is a schematic structural diagram showing a chip inductance element according to a second embodiment of this invention.

A chip inductor element according to embodiment 2 of this invention will be described with reference to FIG. 4. The chip inductor element shown in FIG. 4 is constituted by stacking unit substrates each comprising a wiring 202 formed on a low permittivity insulator substrate 201 by conductive paste printing or the like and a via hole (connection hole) 203 for mutual connection when there is underlayer wiring, and forming an electrode 204 at an end surface.

The low permittivity insulator substrate 201 preferably has a low permittivity in terms of reducing the parasitic capacitance between the wirings and the relative permittivity is preferably 4 or less, more preferably 3 or less, and further preferably 2.5 or less, while the effect of this embodiment can be obtained if it is smaller as compared with a current ceramic-based material (relative permittivity is about 10 or more). As such a low permittivity insulator substrate, a material with a low permittivity and a small dielectric loss is preferable and there is cited a cycloolefin resin, a polyolefin resin, a Teflon (registered trademark) resin, an acrylic resin, an epoxy resin, a liquid crystal resin, a fluororesin, or the like. The cycloolefin resin, the polyolefin resin, the fluororesin, the liquid crystal resin having a relative permittivity of 2.5 to 3, or the like is preferable. Since the permittivity is lower as compared with the conventional ceramic-based material, it is possible to reduce the parasitic capacitance and thus improve the self-resonant frequency of the inductor.

Figure 5:
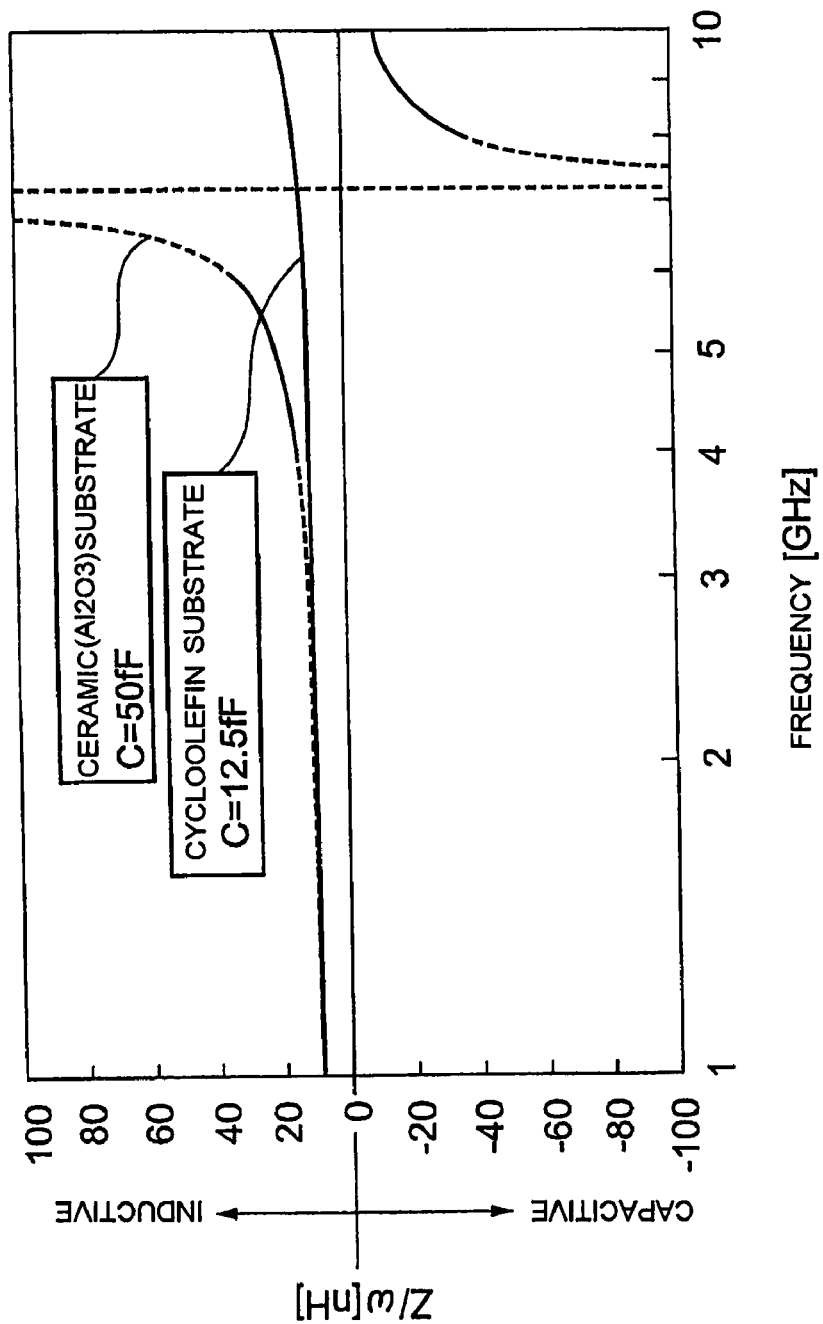
FIG. 5 is a characteristic diagram showing a comparison of frequency characteristics between a chip inductor element according to this invention and a conventional chip inductor element.

FIG. 5 shows an example of comparison between the chip inductor element formed in this embodiment and a conventional chip inductor element. FIG. 5 is a characteristic diagram showing the frequency characteristics of the chip inductor elements, wherein the axis of abscissas represents signal frequency and the axis of ordinates shows values, as normalized inductance values, each derived by dividing a high frequency impedance by a frequency. The comparison was made between the case where an inductor was formed using an alumina ceramic substrate and the case where an inductor was formed using a cycloolefin substrate. The normalized inductance value at low frequencies was 10 nH and, in the case of the alumina ceramic substrate, the parasitic capacitance was 50 fF and the self-resonant frequency was 7.1 GHz. On the other hand, in the case of the cycloolefin substrate, the parasitic capacitance was 12.5 fF and the self-resonant frequency was 14.3 GHz. It is understood that, using the low permittivity substrate, the self-resonant frequency was improved and thus the frequencies usable for an inductance element was improved.

Embodiment 3

A chip inductor element according to embodiment 3 of this invention will be described referring again to FIG. 4. The chip inductor element shown in FIG. 4 is constituted by stacking unit substrates each comprising a wiring 202 formed on a magnetic dielectric substrate 201 by conductive paste printing or the like and a via hole (connection hole) 203 for mutual connection when there is underlayer wiring, and forming an electrode 204 at an end surface.

The magnetic dielectric 201 is obtained by dispersing fine magnetic materials in a low permittivity resin. It is preferable that the size of the fine magnetic material is sufficiently smaller than a skin depth and sufficiently smaller than a size of magnetic domain. In the case of being used at a signal frequency of about 1 GHz to 10 GHz, the size is preferably 1 µm or less and more preferably 100 nm or less. Accordingly, if, for example, use is made of fine magnetic materials each having a size of about several ten nm, they contribute solely to increasing the permeability of the dielectric without any hysteresis loss. Therefore, it is possible to form a chip inductor with a lower loss and a smaller size as compared with a conventional chip inductor formed of ceramic such as ferrite. Further, using a plastic material as a dielectric material forming the magnetic dielectric substrate, the relative permittivity can be made sufficiently smaller as compared with a relative permittivity of 10 to 15 of the conventional ferrite material. Therefore, the parasitic capacitance between the wirings can be reduced to thereby improve the self-resonant frequency of the inductor.

As fine magnetic materials or a fine magnetic powder dispersed in the magnetic dielectric 201, for example, a magnetic metal such as Fe, Co, or Ni, a metal oxide magnetic material such as ferrite, or a ferromagnetic material formed by another method is used. Such material is formed to have a size smaller than the size of magnetic domain, for example, a size of about several ten nm, by a gas evaporation method, an atomizing method, a chemical synthesis method, or the like. Since the properties of superparamagnetic materials are exhibited, there is no hysteresis loss and thus the Q value of inductance can be improved.

Further, as the dielectric material forming the magnetic dielectric 201 itself, use may be made of a cycloolefin-based resin, a Teflon (registered trademark) resin, an acrylic resin, an epoxy resin, or the like. Since the permittivity is lower as compared with the conventional ceramic-based material, it is possible to reduce the parasitic capacitance and thus improve the self-resonant frequency of the inductor.

Further, the dielectric material as described above has a high heat-resistant temperature and, therefore, the properties do not change in a short-time heat treatment such as solder reflow. When a sufficient inductance value can be ensured without using the magnetic dielectric, such as in the case where the inductance value is about several nm, use may be made of a resin substrate with a reduced permittivity and a reduced influence of parasitic capacitance and the resin used in embodiment 1 can be suitably used.

As described above, using, as a substrate material of a chip element, a plastic, i.e. an organic resin material or organic resin compounds being a low dielectric material, it is possible to reduce parallel parasitic capacitance of a chip resistor or a chip inductor and, as a result, it is possible to form the chip element with only slight degradation of impedance characteristics even in a high frequency region, i.e. a GHz band. Therefore, according to this invention, a 1 kΩ chip resistance element, use of which has conventionally been difficult at 1 GHz or more, becomes sufficiently usable at a frequency of about 1 GHz or more and it is possible to form a chip inductance element with only slight degradation of impedance characteristics even in a high inductance region.

In this invention, using a resin being a low dielectric material as a substrate material of a chip element, it is possible to reduce parasitic capacitance at high frequencies and, thus, there is obtained a chip element, particularly a chip resistance element or a chip inductance element, with only slight degradation of impedance characteristics even in a high frequency region, i.e. a GHz band.

INDUSTRIAL APPLICABILITY

Chip elements of this invention can be used as elements in a GHz band and thus are applicable to various electrical apparatuses such as a portable telephone and a computer that operate in the GHz band.

The invention claimed is:

1. A chip element comprising a substrate, an impedance element formed on said substrate, and a plurality of electrodes connected to said impedance element;
    wherein said substrate is formed of a low permittivity material having a permittivity low enough to reduce parasitic capacitance in a GHz band;
    wherein said low permittivity material has a dielectric loss of $1 \times 10^{-2}$ or less, a relative permittivity of 4 or less, and a glass transition temperature of 100° C. or more.

2. A chip element according to claim 1, wherein said low permittivity material includes an organic material.

3. A chip element according to claim 2, wherein said organic material includes a resin.

4. A chip element according to claim 3, wherein said resin includes a resin selected from the group consisting of a fluororesin, an acrylic resin, an epoxy resin, a liquid crystal resin, a phenolic resin, a polyester resin, a denatured polyphenyl ether resin, a bismaleide triazine resin, a denatured polyphenylene oxide resin, a silicon resin, a benzocyclobutene resin, a polyethylene naphthalate resin, a polycycloolefin resin, a polyolefin resin, a cyanate ester resin, and a melamine resin.

5. A chip element according to claim 1, wherein said impedance element is one of a chip resistance element and a chip inductance element.

6. A chip element according to claim 5, wherein said chip element is the chip inductor element and said substrate contains a magnetic powder.

7. A chip element according to claim 6, wherein said magnetic powder has a particle size of less than 100 nm.

8. A chip element according to claim 1, wherein said chip element is a chip inductor element that operates in a frequency range of 10 GHz or greater.

* * * * *